INVENTORS
Harold L. Christy
Lee E. Folk
BY
ATTY'S.

INVENTORS
Harold L. Christy
Lee E. Folk
BY
Mueller, Aichele & Rauner
ATTYS.

3,460,238
Patented Aug. 12, 1969

3,460,238

WIRE SEVERING IN WIRE BONDING MACHINES

Harold L. Christy and Lee E. Folk, Phoenix, Ariz., assignors to Motorola, Inc., Franklin Park, Ill., a corporation of Illinois Filed Apr. 20, 1967, Ser. No. 632,362
Int. Cl. B26f *3/00;* B65h *35/10*
U.S. Cl. 29—481 3 Claims

ABSTRACT OF THE DISCLOSURE

A wire severing operation in a wire bonding machine comprising moving the bonding needle with holding pressure sufficient to frictionally engage the wire and insufficient to deform the wire away from the bond area for pulling the wire such that it breaks at one end of the bond.

BACKGROUND OF THE INVENTION

This invention relates to wire bonding machines, particularly for such machines programmed to sever the wire after a certain bond operation has been performed.

When bonding wires between semiconductor dies and connecting pins in a semiconductor device assembly, it is necessary to sever the wire after making one of the two bonds. To date, such wire severing has been performed by apparatus such as clamps which may pull the wire for breaking it at the bonding area. Other bonding machines include a scissors type of operation for cutting the wire immediately adjacent to the bond area which may leave a short undesirable tab at the bonding area.

SUMMARY OF THE INVENTION

An object of this invention is to provide wire severing in a wire bonding machine which utilizes the wire bonding tool for the severing operation.

Apparatus incorporating the teachings of this invention include the feature that a bonding needle compresses a wire to be bonded against a bonding pad and thence it is removed from the bonding area to engage the wire immediately adjacent to such bond. The needle then forcefully holds the wire by a force insufficient to deform such wire and is simultaneously moved laterally away from the bond causing the wire to break at one end of the bonding area. Another feature of this invention is that in so dragging the wire the strength of the bond is tested; if weak, the wire will pull off the bonding pad destroying the connection. The edge of a bonding pad can be used to assist in severing the wire.

THE DRAWING

DESCRIPTION OF THE ILLUSTRATIVE EMBODIMENT

Figure 1:
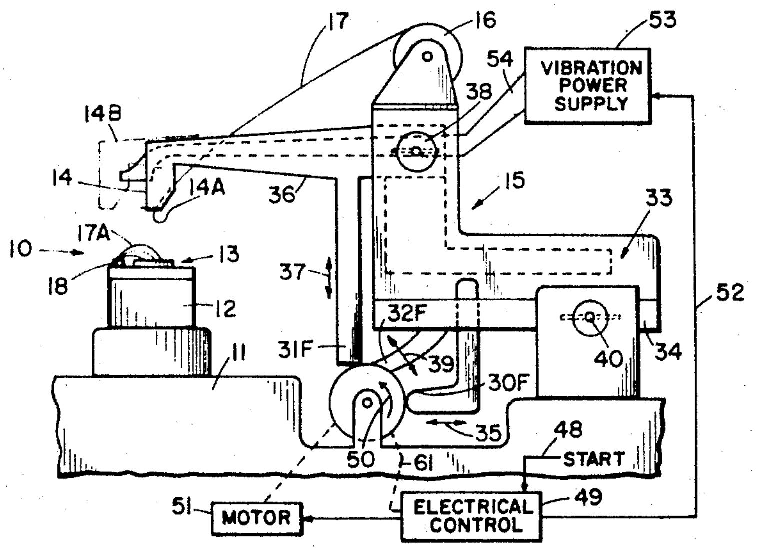
FIG. 1 is a simplified elevational view of one apparatus incorporating the teachings of this invention.

Referring to FIG. 1, there is shown a bonding machine which illustrates the present invention. Work station 10 mounted upon machine frame 11 has a workpiece carrier 12 supporting a workpiece 13 which in this illustration is an incomplete semiconductor device. A bonding needle

14 is positioned for work by a mechanism generally designated 15, as will be described. Wire supply 16 supplies wire 17 through needle 14 for making electrical connection 17A between device 13 and connecting pin 18. Operations of wire bonding machines are generally well known. The present invention, as embodied and practiced in the illustrated FIG. 1 machine, causes bonding needle 14 to engage wire 17 adjacent a bond, later described, on device 13 to the right as seen in FIG. 1 for severing the wire adjacent to the bond. Such severing frees wire 17 for movement to the next device (not shown) permitting needle 14 to make an electrical connection thereto.

The description of the wire severing operation is described in detail with respect to FIGS. 2 through 7 without reference to the operation of mechanism 15 to FIG. 1. The description of that operation is covered with respect to FIGS. 1 and 8 in the last part of this specification.

Figure 2:
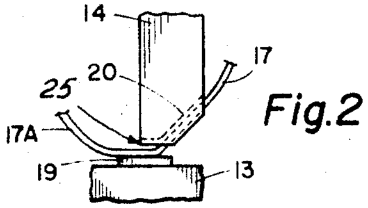
FIGS. 2–6 are greatly enlarged and schematic views of the FIG. 1 needle during various positions in a wire severing operation.

Referring now to FIG. 2, the position of bonding needle 14 with respect to device 13 just prior to a wire bonding operation is shown. Semiconductor device 13 has a metalized layer or bonding pad 19 disposed thereon with electrical connection wire 17A extending to pin 18 (not shown in FIG. 2) which has previously been bonded. Needle 14 has been positioned and is exerting force on wire 17 against bonding pad 19. Needle 14 has elongated aperture 20 through which wire 17 readily moves such that as the needle moves the wire is supplied to bonding areas in a known manner.

Figure 3:
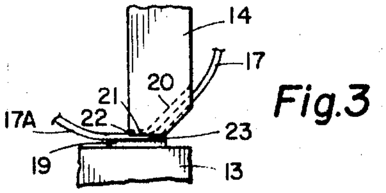
Figure 4:
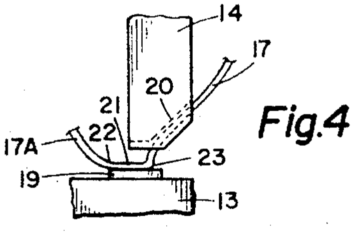

FIG. 3 shows the position of needle 14 after the bonding operation is completed. In the particular described apparatus, the bond is performed by pressure applied through needle 14 against pad 19 augmented by mechanical vibratory energy applied thereto for deforming wire 17 in bond area 21 with shoulders 22 and 23 at the extremities of the bond. Such bonding operations are known. Referring now to FIG. 4, needle 14 is shown rising from bond area 21, clearly showing shoulders 22 and 23 at the bond extremities. Wire 17 slides through aperture 20 in needle 14. As needle 14 rises, it also moves to the right as viewed in FIG. 4 to the lateral position shown in FIG. 5. Once it has moved to the lateral position, and engages wire 17 adjacent bond area 21 the pressure is again applied to needle 14. Vibratory energy is not applied at this time because it is not desired to lower the yield strength of wire 17.

Figure 5:
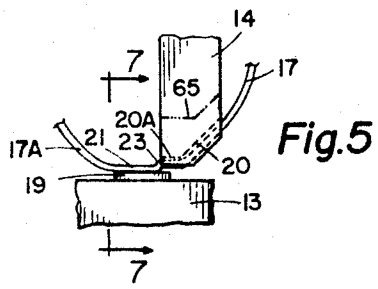
Figure 6:
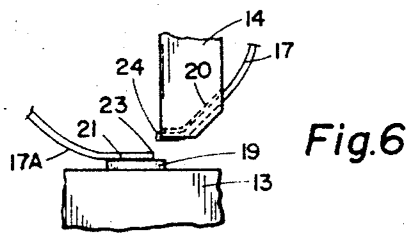
Figure 7:
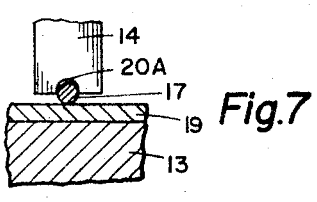
FIG. 7 is an enlarged view taken in the direction of the arrows 7—7 in FIG. 5 and shows the engaging relation of the bonding needle.

As best seen in FIG. 7, needle 14 is provided with groove 20A which is an extension of aperture 20. It should be noted that in FIG. 7 needle 14, because of groove 20A, engages wire 14 across a substantial peripheral area thereof whereas wire 17 engages bonding pad 19 of device 13 substantially on one radius. If needle 14 is forced against wire 17 and then moved laterally, i.e., to the right as shown in FIGS. 5 and 6, there is greater frictional engagement between needle 14 and wire 17 than between wire 17 and pad 19. As a result, relative movement between wire 17 and needle 14 is inhibited causing the wire to break and move along pad 19. Wire 17, being of a small diameter, for example, 3 mils or less, and having been weakened at extremity 23 of bond 21, breaks or severs at the end of such bond.

FIG. 6 shows needle 14 carrying severed wire 17 away from bond 21. In the illustration, needle 14 engaged wire 17 somewhat removed from end 23 such as to leave small end portion 24 extending outwardly from under needle 14. Such extension enables visual inspection by an operator (not shown) that wire 17 is being carried by needle 14 to the next bonding position (not shown).

Also seen in FIG. 6, after wire 17 is severed from bond 21, a clean break is provided at end 23 with no loose extensions thereof. Another feature of this invention is that when needle 14 is frictionally engaging wire 17 and moving it laterally to the right as seen in FIGS. 5 and 6, there is a lateral force applied to the bond between bond portion 21 and bonding pad 19. If such bond is weak, the lateral force applied through wire 17 may be sufficient to tear wire 17 from pad 19. In this manner, the described wire severing operation also serves as a quality control operation in the bonding machine for detecting weak or ineffective bonds.

The positioning of needle 14 on wire 17 for the severing operation just described is not critical. It is preferred that edge 25 of needle 14 (FIG. 2) be placed closely adjacent to bond end 23 such that no loose ends will be left extending from bond area 21. It is to be understood that back edge 25 of needle 14 may be placed remote from end 23 with a successful wire severing operation still being performed. In another situation, needle 14 forces wire 17 against device 13 severing the wire at a corner at the end of bonding pad 19. Even with such modification, it may be desired to move needle 14 and, therefore, wire 17 laterally away from bond portion 21, as described above.

Figure 8:
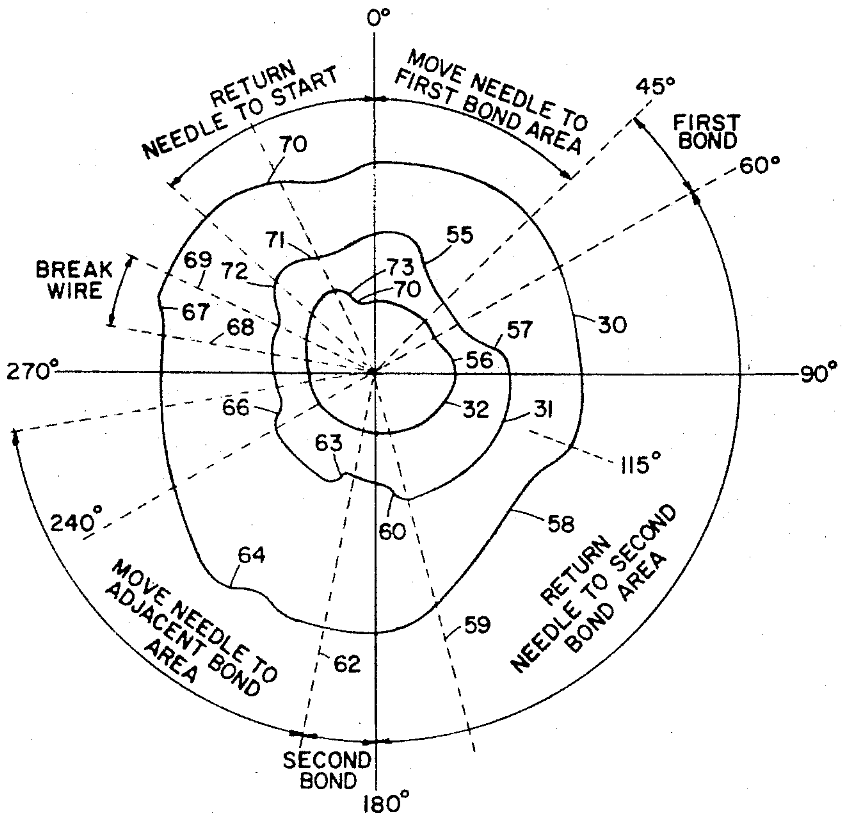
FIG. 8 is a graphical presentation of the cam controls used to operate the FIG. 1 apparatus with greatly distorted undulations in the three illustrated cams to clearly present the operation.

The operation of mechanism 15 of the FIG. 1 bonding machine is described by joint reference to FIGS. 1 and 8. FIG. 8 shows three cams 30, 31, and 32 which selectively actuate movements in needle 14 for performing the above described operations and also for positioning the needle with respect to pin 18 and device 13 for performing bonding operations in a known manner. In one embodiment of the mechanism 15, the three cams 30, 31, and 32 all have approximately the same diameter. For clearly pointing up the relationship in operation provided by the three cams, they are shown in FIG. 8 as having greatly different diameters in order to clearly show the angular relationships and timing for moving needle 14. The operation of the machine is described in the context of making one electrical connection between device 13 through its bonding pad 19 and pin 18 by bonding connection wire portion 17A therebetween and severing the wire as described with reference to FIGS. 2 through 6. One such electrical interconnection requires two bonds and one wire severing operation.

Referring now to FIG. 8, the rest or start position of the three cams is indicated at the top of the figure by 0°. The cams all rotate in the same direction as indicated by arrow 50. Cam 30 engages cam follower 30F (FIG. 1) for selectively moving carriage 33 in the directions of the arrows 35 on a precision slide bearing (not shown) on mechanism supporting plate 34. Needle 14 moves in the direction of arrow 35 with carriage 33. Cam 31 engages cam follower 31F for causing movements in the directions of the arrows 37 for rotating needle support assembly 36, including needle 14, around pivot point 38 formed on carriage 33. Cam 32 engages cam follower 32F for causing it to move in the directions of the arrows 39 for rotating carriage support plate 34, and, therefore, needle 14, about pivot axis 40 in frame 11.

The two pivots 38 and 40 are necessary to keep end 14A of needle 14 parallel with the surface of bonding pad 19 and the bonding surface of pin 18. Usually in bonding electrical connection wire 17A between the pin 18 and device 13, such bonding areas are at different heights or elevations in the bonding area. Therefore, needle 14 descends by rotation different distances to engage wire 17 at the respective bonding areas. Cams 31 and 32 are designed such that the rotation of carriages 33 about pivot 40 and rotation of needle support 36 about pivot 38 are coordinated such that end 14A is parallel to bonding pad 19 during the bonding operation and wire severing operation and is parallel to the bonding surface on pin 18 during that bonding operation. Such parallelism is important to obtain a good bond. The action of the spaced apart pivots 38, 40 is similar to the action provided by the well-known pantograph.

Returning now to the description of the operation, an operator or an automatic device supplies a start signal over line 48 to electrical control 49 which activates motor 51 to rotate cams 30, 31, 32, and other cams (not shown) in the direction of arrow 50 for operating the bonding machine. All timing and actuations are provided by the cam assembly. The details of electrical control 49 are not important to the practice of this invention and, therefore, are not described.

The first operation to be accomplished in the bonding machine is to move the bonding needle 14 to a first bond area on pin 18 from the rest or 0° position. The start or rest position is indicated by dotted lines 14*b*; the needle 14 is hovering over pin 18. Wire 17 has already been threaded through aperture 20 and is carried by bonding needle 14 down to the bond area on pin 18. Referring to FIG. 8, this operation is accomplished in the arcuate section between 0° and 45°. Cam 32 is a short radius indicating that carriage support plate 34 is in a first rotational position with respect to pivot 40 which is designed in cooperation with the pivoted position of arm 36 on pivot 38 to make end 14A parallel to the bonding area of pin 18. In the 0°–45° arc, cam 32 has a fall or decreasing radius at 55. This decreasing radius causes needle support 36 to rotate clockwise about pivot 38 lowering needle 14 to bond area on pin 18. In arc 0°–45°, cam 30 maintains its radius since in the rest or starting position needle 14 is hovering over the bond area of pin 18.

The first bond is performed in the arcuate portion between 45° and 60° wherein all three cams maintain the same radius indicating that needle 14 is not moved. Welding pressure for bonding is provided by cam 31 having a radius sufficiently small after decreasing radius 55 to permit an urging means (not shown) to force needle 14 against wire 17. At 45°, in response to a cam (not shown) indication represented by line 61, electrical control 49 supplies an actuating signal over line 52 to vibration power supply 53. At 60° rotation the vibratory energy is removed. Supply 53 supplies mechanical vibrations through horn or sonic duct 54 to needle 14 for causing it to vibrate. Such vibrations are then translated from needle 14 to wire 17. The welding force augmented by the mechanical vibrations, which serve to lower the yield strength of wire 17, perform a bond between wire 17 and the bonding area on pin 18.

After the completion of the first bond on pin 18, the needle is moved upwardly and to the right (as seen in FIG. 1) by a sequence of undulations on cams 30, 31, and 32 as will now be described. First cam 32 has radius increase at 56 thereon rotating the mechanism 15 about pivot 40 adjusting its rotational position such that end 14A is moved to be flat against bonding pad 19, which is at a higher elevation than the bonding area of pin 18. Also, between 60° and 90° the rise or increasing radius at 57 on cam 31 raises needle 14 from the bonding area on pin 18. There is a rise or increasing radius at 58 on cam 30 beginning at 115° which moves needle 14 after it was raised to lower area bonding pad 19. The rise on cam 30 causes cam follower 30F to move to the right as seen in FIG. 1, thereby moving needle 14 from a position over pin 18 as indicated by dotted line 14B to the position indicated by the solid lines in FIG. 1. Such lateral movement of needle 14 is completed adjacent radius line 59.

Between radial line 59 and the 180° rotational position of the cams, cam 31 has a decreasing radius or fall at 60 which causes cam follower 31F to lower needle 14 to the position indicated in FIG. 2. Such lowering is completed at the 180° rotational position.

The second bond is then performed as described for the first bond. Upon reaching the 180° point, a cam (not shown) closes an electrical switch (not shown) supplying an indication in electrical control 49 as indicated by dash line 61 in FIG. 1 that a bonding operation is to be initiated. Such type of controls from cams for providing timing controls of electrical circuits are well known and will not be described. The vibrational energy is then supplied to needle 14A as above described between 180° rotational mark and the cam rotational position indicated by radial line 62 at which time the vibrational energy is stopped. Radial line 62 indicates the completion of the bonding operation during which time the radius of all three cams remained the same.

The next operation is to laterally move the needle to a position adjacent the bond area such as shown in FIG. 5. First, the needle is raised from bond area 21 as indicated by the increasing radius of cam 31 at 63. Subsequent to raising the needle increasing radius at 64 of cam 30 moves needle 14 to the right from hovering over bond area 21 to the position immediately above the position of FIG. 5 as indicated by dotted lines 65 in FIG. 5. Needle 14 is now in hovering position over the wire severing position of device 13. Next, the needle is lowered by decreasing radius at 66 on cam 31; lowering the needle to the position indicated in FIG. 5 by the solid lines. The needle now is in position for lateral movement for severing the wire.

The wire severing operation is provided by dragging the needle with the wire along device 13. Such action is provided by the small rise or increasing radius at 67 on cam 30 between radial lines 68 and 69. The wire is severed or broken by this action.

Subsequent to the wire breaking, the needle 14 is then returned to the start position or 0° indicated by dotted line 14B in FIG. 1 and corresponds to the 0° radial line in FIG. 8. To this end, the cam 30 has a decreasing radius at 70 for moving the carriage 33 to the left while cam 31 has a decreasing radius at 71 for returning needle 14 to a hovering position after being rotated upwardly by the rise at 72. Also, cam 32 has a fall at 73 for rotation of carriage plate 34 about pivot 40 to maintain end 14A in a parallel relation to the bond area of pin 18. It is seen, therefore, that needle 14 is now in a start position for repeating the above described operations. Also, a timing cam (not shown) deactivates control 49 turning motor 51 off.

We claim:

1. A method of attaching a discrete section of wire to a bond area on a device in which the wire is bonded to such bond area by transfer of a bonding energy through a bonding needle, the improvement including the following steps in combination, removing the bonding energy from the needle, moving the needle vertically and laterally to engage the wire away from the bond area, and moving the needle further away from the bond area along the device and frictionally moving the wire therewith such that the wire severs adjacent to the bond area.

2. The method of claim 1 wherein said bonding energy consists of a pressure welding force and a vibratory force and said welding force without said vibratory force is used to engage the needle with the wire.

3. The method of claim 1 wherein the needle has a concave groove for engaging the wire such that the area of contact between the wire and the needle is greater than between the wire and the device.

References Cited

UNITED STATES PATENTS

| | | | |
|---|---|---|---|
| 3,380,155 | 4/1968 | Burks | 29—487 X |
| 3,305,157 | 2/1967 | Pennings | 228—1 |
| 3,295,396 | 1/1967 | Kolb | 29—481 X |
| 3,192,610 | 7/1965 | Keating | 225—103 X |
| 3,087,239 | 4/1963 | Clagett | 29—480 X |

JOHN F. CAMPBELL, Primary Examiner

R. B. LAZARUS, Assistant Examiner

U.S. Cl. X.R.

29—475; 225—93